United States Patent
Jung

(10) Patent No.: US 11,646,257 B2
(45) Date of Patent: May 9, 2023

(54) ELECTRONIC DEVICE MODULE AND MANUFACTURING METHOD THEREOF

(71) Applicant: Samsung Electro-Mechanics Co., Ltd., Suwon-si (KR)

(72) Inventor: Chulhwan Jung, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 17/102,944

(22) Filed: Nov. 24, 2020

(65) Prior Publication Data

US 2022/0051971 A1    Feb. 17, 2022

(30) Foreign Application Priority Data

Aug. 12, 2020 (KR) .................... 10-2020-0101222

(51) Int. Cl.
*H01L 23/00* (2006.01)
*H01L 25/065* (2023.01)
(Continued)

(52) U.S. Cl.
CPC ...... *H01L 23/49833* (2013.01); *H01L 21/563* (2013.01); *H01L 23/13* (2013.01);
(Continued)

(58) Field of Classification Search
CPC ............... H01L 23/49833; H01L 24/73; H01L 25/0657
See application file for complete search history.

(56) References Cited

U.S. PATENT DOCUMENTS 7,863,735 B1 * 1/2011 Cho .................. H01L 25/16
257/723
7,872,343 B1 * 1/2011 Berry ................ H01L 23/5385
257/687
(Continued)

FOREIGN PATENT DOCUMENTS

JP  2004-128288 A   4/2004
JP  2016-158145 A   9/2016
(Continued)

OTHER PUBLICATIONS

Korean Office Action dated Oct. 27, 2021, in counterpart Korean Patent Application No. 10-2020-0101222 (4 pages in Korean).
(Continued)

*Primary Examiner* — Michele Fan
(74) *Attorney, Agent, or Firm* — NSIP Law

(57) ABSTRACT

An electronic device module includes a first board including a first side and a second side facing in opposite directions, the first side of the first board being configured to have a first electronic device mounted thereon; a second board adhered to the second side of the first board, and including a device accommodating portion that is a space formed by removing a central portion of the second board; a second electronic device disposed in the device accommodating portion and mounted on the second side of the first board so that the second electronic device is adjacent to an internal edge side of the second board defining a boundary of the device accommodating portion; and a bonding layer disposed in a gap between the first board and the second board and extending into a gap between the second side of the first board and the second electronic device, the bonding layer bonding the second board and the second electronic device to the first board.

18 Claims, 10 Drawing Sheets

(51) Int. Cl.
*H01L 23/498* (2006.01)
*H01L 23/13* (2006.01)
*H01L 25/16* (2023.01)
*H01L 25/00* (2006.01)
*H01L 21/56* (2006.01)
*H01L 23/552* (2006.01)

(52) U.S. Cl.
CPC .......... *H01L 24/73* (2013.01); *H01L 25/0657* (2013.01); *H01L 25/16* (2013.01); *H01L 25/50* (2013.01); *H01L 23/49811* (2013.01); *H01L 23/552* (2013.01); *H01L 2224/73204* (2013.01); *H01L 2225/06517* (2013.01); *H01L 2225/06572* (2013.01)

(56) References Cited

U.S. PATENT DOCUMENTS

| | | | |
|---|---|---|---|
| 9,392,695 | B2 | 7/2016 | Cho |
| 10,593,565 | B2 | 3/2020 | Darveaux |
| 2003/0052419 | A1 | 3/2003 | Ujiie et al. |
| 2011/0031610 | A1* | 2/2011 | Yamazaki ........... H01L 23/4985 257/E23.068 |
| 2012/0074586 | A1* | 3/2012 | Seo ....................... H01L 23/467 257/774 |
| 2013/0127025 | A1 | 5/2013 | Cho |
| 2013/0270685 | A1* | 10/2013 | Yim ...................... H01L 21/563 257/686 |
| 2014/0299976 | A1 | 10/2014 | Cho |
| 2015/0206869 | A1* | 7/2015 | Kim .................. H01L 23/49816 438/109 |
| 2019/0295984 | A1* | 9/2019 | Lin ................... H01L 23/49816 |
| 2021/0175177 | A1* | 6/2021 | Kim ....................... H01L 21/568 |

FOREIGN PATENT DOCUMENTS

| | | | | |
|---|---|---|---|---|
| KR | 10-0918745 B1 | 9/2009 | | |
| KR | 10-2015-0000173 A | 1/2015 | | |
| KR | 20150000173 A | * | 1/2015 | |
| KR | 10-1539885 B1 | 7/2015 | | |
| KR | 10-2017-0137023 A | 12/2017 | | |
| WO | WO-2013094606 A1 | * | 6/2013 | ............. B32B 27/08 |
| WO | WO-2018125166 A1 | * | 7/2018 | ......... H01L 21/4853 |

OTHER PUBLICATIONS

Korean Office Action dated Apr. 8, 2022, in counterpart Korean Patent Application No. 10-2020-0101222 (2 pages in English and 2 pages in Korean).

* cited by examiner

ELECTRONIC DEVICE MODULE AND MANUFACTURING METHOD THEREOF

CROSS-REFERENCE TO RELATED APPLICATIONS

This application claims the benefit under 35 USC 119(a) of Korean Patent Application No. 10-2020-0101222 filed on Aug. 12, 2020, in the Korean Intellectual Property Office, the entire disclosure of which is incorporated herein by reference for all purposes.

BACKGROUND

1. Field

This application relates to an electronic device module and a manufacturing method thereof.

2. Description of Related Art

With the development of smart devices, demands on personal or portable products are steeply increasing in the electronic product market. While functions and performance of the smart devices have been improved, down-sizing and weight reduction of electronic devices installed in the above-noted product systems are continuously needed to enhance portability.

To realize the down-sizing and weight reduction of electronic devices, technical developments for integrating multiple individual devices into a single electronic part have progressed together with technical developments toward reduction of respective sizes of mounted parts. For example, a system on chip (SoC) is a technology for integrating a part of a computer or a battery system into one integrated circuit, a system in package (SIP) is a technology for mounting a plurality of circuits configured as an individual chip into a single package, and a chip-scale package (CSP) (originally chip-size package) is a technology for realizing lightness of weight, slimness, shortness, and smallness of a package that is substantially the same size as the chip.

Further, a module in a double-sided mounting package type for disposing components on respective sides of the module has been developed to down-size the module. Radio-frequency integrated circuit (RFIC) components used in the module need to be down-sized, so they have been implemented as a CSP package having a fine pitch and small bump form. However, when an IC of the small bump form is exposed to the outside, the reliability of a bump bonding portion may be deteriorated by external physical impacts and high and low temperatures.

The above information disclosed in this Background section is only for enhancement of understanding of this application, and therefore it may contain information that is known to the inventor of this application, but is not prior art.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, an electronic device module includes a first board including a first side and a second side facing in opposite directions, the first side of the first board being configured to have a first electronic device mounted thereon; a second board adhered to the second side of the first board, and including a device accommodating portion that is a space formed by removing a central portion of the second board; a second electronic device disposed in the device accommodating portion and mounted on the second side of the first board so that the second electronic device is adjacent to an internal edge side of the second board defining a boundary of the device accommodating portion; and a bonding layer disposed in a gap between the first board and the second board and extending into a gap between the second side of the first board and the second electronic device, the bonding layer bonding the second board and the second electronic device to the first board.

The electronic device module may further include an insulating protection layer disposed on the second side of the first board in the gap between the first board and the second board, wherein the internal edge side of the second board may be closer to a lateral side of the second electronic device is facing the internal edge side than to the insulating protection layer in a direction perpendicular to the internal edge side.

The electronic device module may further include an insulating protection layer disposed on the second side of the first board and having a trench formed therein, the trench extending along a boundary between a first region of the device accommodating portion in which the second electronic device is mounted and a second region of the device accommodating portion different from the first region of the device accommodating portion.

The trench may extend to surround the second region in the device accommodating portion of the second board.

The bonding layer may extend so that one end of the bonding layer contacts the trench.

The second electronic device may have a rectangular shape when viewed in a direction perpendicular to the second side of the first board, and may be disposed so that at least two lateral sides of the second electronic device that are adjacent to each other face the internal edge side of the second board and are adjacent to the internal edge side of the second board.

The bonding layer may include an underfill filling the gap between the second side of the first board and the second electronic device.

The bonding layer may further include a sidefill filling a space between the internal edge side of the second board and a lateral side of the second electronic device facing the internal edge side of the second board.

The second electronic device may be an integrated circuit (IC) chip.

The IC chip may be a radio-frequency integrated circuit (RFIC) chip.

The IC chip may be a chip-scale package (CSP).

The bonding layer may include an insulating resin.

In another general aspect, a method of manufacturing an electronic device module includes mounting a first electronic device on a first side of a first board including the first side and a second side facing in opposite directions; forming a molded portion covering and sealing the first electronic device on the first electronic device and the first side of the first board; attaching a second board to the first board, the second board including a device accommodating portion formed by removing a central portion of the second board; mounting a second electronic device on the second side of the first board by disposing the second electronic device in the device accommodating portion so that the second electronic device is adjacent to an internal edge side of the second board defining the device accommodating portion; injecting a liquefied insulating resin into a gap between the first board and the second board and a gap between the second side of the first board and the second electronic device; and curing the liquefied insulating resin.

The injecting of the liquefied insulating resin may include injecting the liquefied insulating resin so that the liquefied insulating resin extends from the gap between the first board and the second board to fill the gap between the second side of the first board and the second electronic device.

In another general aspect, an electronic device module includes a first board including a first side and a second side facing in opposite directions, the first side of the first board being configured to have a first electronic device mounted thereon; a second board adhered to the second side of the first board, and including a device accommodating portion that is a space formed by removing a central portion of the second board; a second electronic device disposed in the device accommodating portion and mounted on the second side of the first board so that the second electronic device is spaced apart from an internal edge side of the second board defining a boundary of the device accommodating portion; and a continuous bonding layer bonding the second board and the second electronic device to the first board, the continuous bonding layer filling a gap between the first board and the second board, extending across a space between the internal edge side of the second board and the electronic device, and filling a gap between the second side of the first board and the second electronic device.

The electronic device module of may further include an insulation protection layer disposed on the second side of the first board in the gap between the first board and the second board, wherein the internal edge side of the second board may be closer to a lateral side of the second electronic device facing the internal edge side than to the insulation protection layer in a direction perpendicular to the internal edge side.

The electronic device module may further include an insulation protection layer disposed on the second side of the second board and having a trench formed therein, the trench dividing the device accommodating region into a first region in which the second electronic device is mounted and a second region, wherein the insulation protection layer may be spaced apart from the second electronic device, and the continuous bonding layer may extend from the gap between the second side of the first board and the second electronic device to the insulation protection layer across a space between the second electronic device and the insulation protection layer.

The continuous bonding layer may extend to contact the trench.

The continuous bonding layer may include an underfill filling the gap between the first board and the second board, a sidefill filling the space between the internal edge side of the second board and the electronic device, and an underfill filling the gap between the second side of the first board and the second electronic device.

The electronic device module may further include external connection pads disposed on the second side of the first board within a mounting region of the second electronic device, wherein the second electronic device may be a chip-scale package including copper pillar bumps soldered to the external connection pads, and the underfill filling the gap between the second side of the first board and the second electronic device may surround the copper pillar bumps.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
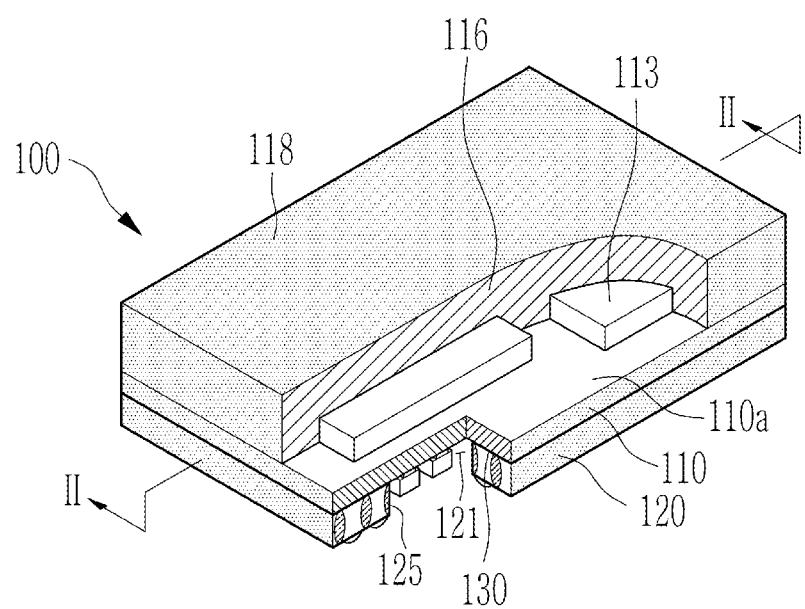
FIG. 1 shows a perspective view of an example of an electronic device module.
Figure 1:
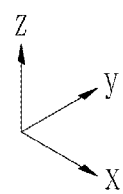

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of functions and constructions that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Use herein of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various elements, these elements are not to be limited by these terms. Rather, these terms are only used to distinguish one element from another element. Thus, a first element referred to in examples described herein may also be referred to as a second element without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated by 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not exclude the presence or addition of one or more other features, numbers, operations, members, elements, and/or combinations thereof.

The features of the examples described herein may be combined in various ways as will be apparent after an understanding of the disclosure of this application. Furthermore, although the examples described herein have a variety of configurations, other configurations are possible as will be apparent after an understanding of the disclosure of this application.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

Figure 2:
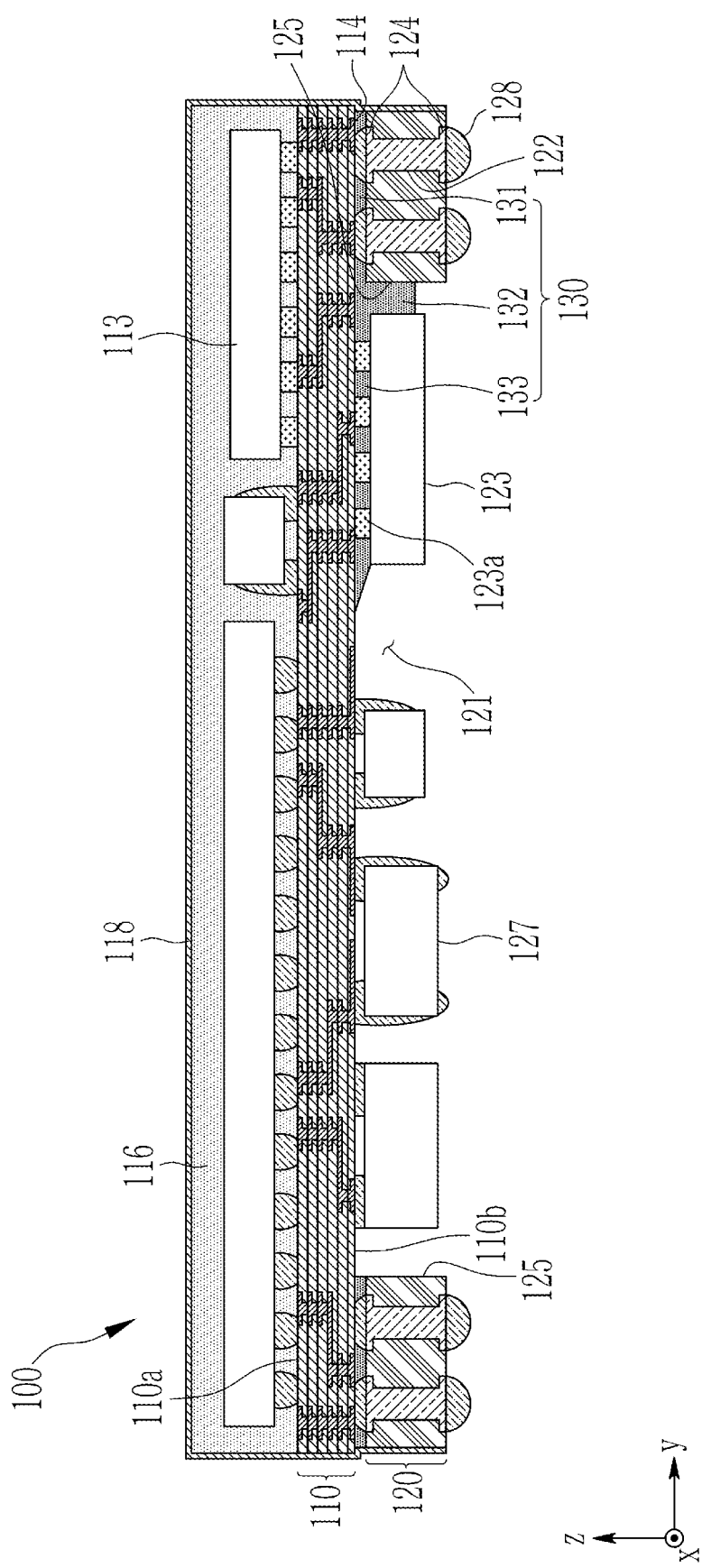
FIG. 2 shows a cross-sectional view taken along the line II-II' in FIG. 1.

FIG. 1 shows a perspective view of an example of an electronic device module, and FIG. 2 shows a cross-sectional view taken along the line II-II' in FIG. 1.

Referring to FIG. 1 and FIG. 2, the electronic device module 100 includes a first board 110 and a second board 120 bonded together by a bonding layer 130 disposed between the first board 110 and the second board 120. The first board 110 may be, for example, a multi-layered circuit board formed by interleaving a plurality of insulation layers and a plurality of wiring layers, and may be configured to be a double-sided circuit board on which wiring layers are disposed on opposite sides of one insulation layer. The first board 110 includes a first side 110a and a second side 110b facing in opposite directions in a z-axis direction as indicated in the drawing.

The second board 120 includes a device accommodating portion 121 that is a space formed by removing a central portion of the second board 120. Therefore, when the second board 120 is attached to the first board 110 by a soldering process, the device accommodating portion 121 forms a concave space exposing part of the second side 110b of the first board 110.

Further, electrode pads 124 may be disposed on top and bottom sides of the second board 120, and conductive vias 122 may connect the electrode pads 124 on the top and bottom sides of the second board 120 to each other.

The electrode pad 124 disposed on the top side of the second board 120 may be electrically connected to an external connection pad 114 of the first board 110. Further, an external connection terminal 128 may be disposed on the electrode pad 124 disposed on the bottom side of the second board 120.

A first electronic device 113 may be mounted on the first side 110a of the first board 110, and a second electronic device 123 may be mounted on the second side 110b of the first board 110. The second electronic device 123 may be disposed in the device accommodating portion 121 of the second board 120 adjacent to an internal edge side 125 of the second board 120.

The first electronic device 113 may be an active device such as an integrated circuit (IC) chip or a passive device. That is, any type of device that may be mounted on the first board 110 or may be installed in the first board 110 is usable as the first electronic device 113. For example, the first electronic device 113 may be a radio-frequency integrated circuit (RFIC) chip, a WiFi integrated circuit (IC) chip, or a multi-layer ceramic capacitor (MLCC).

The second electronic device 123 may be an IC chip, for example, an RFIC chip. Further, the IC chip may be chip-scale package (CSP). The second electronic device 123 may include copper (Cu) pillar bumps 123a with a fine pitch and a small bump electrically connected to some of the external connection pads 114 of the first board 110.

The bonding layer 130 may be disposed in a gap between the first board 110 and the second board 120 to bond the second board 120 to the second side 110b of the first board 110. The bonding layer 130 includes an underfill 131 filling the gap between the first board 110 and the second board 120. Further, the bonding layer 130 may extend into a gap between the second side 110b of the first board 110 and the second electronic device 123 to bond the second electronic device 123 to the first board 110. That is, the bonding layer 130 further includes an underfill 133 for filling the gap between the second side 110b of the first board 110 and the second electronic device 123 and surrounding the copper pillar bumps 123a of the second electronic device 123. The bonding layer 130 further includes a sidefill 132 disposed in a gap between the second board 120 and the second electronic device 123.

The bonding layer 130 may include an underfill resin, and for example, it may be formed by injecting a liquefied insulating material including an epoxy resin, that is, a liquefied underfill resin, between the first board 110 and the second board 120, between the second side 110b of the first board 110 and the second electronic device 123, and between the second board 120 and the second electronic device 123, and then curing the liquefied underfill resin.

A conductive layer 118 is disposed to cover an upper side and a lateral side of a molded portion 116, and may extend to lateral sides of the first board 110 and the second board 120. The conductive layer 118 may be formed by depositing a conductive material along a surface of the molded portion 116 and the lateral sides of the first board 110 and the second board 120 so that the conductive layer 118 functions as an electromagnetic interference (EMI) shielding film. For example, the conductive layer 118 may be deposited by a sputtering process.

Figure 3:
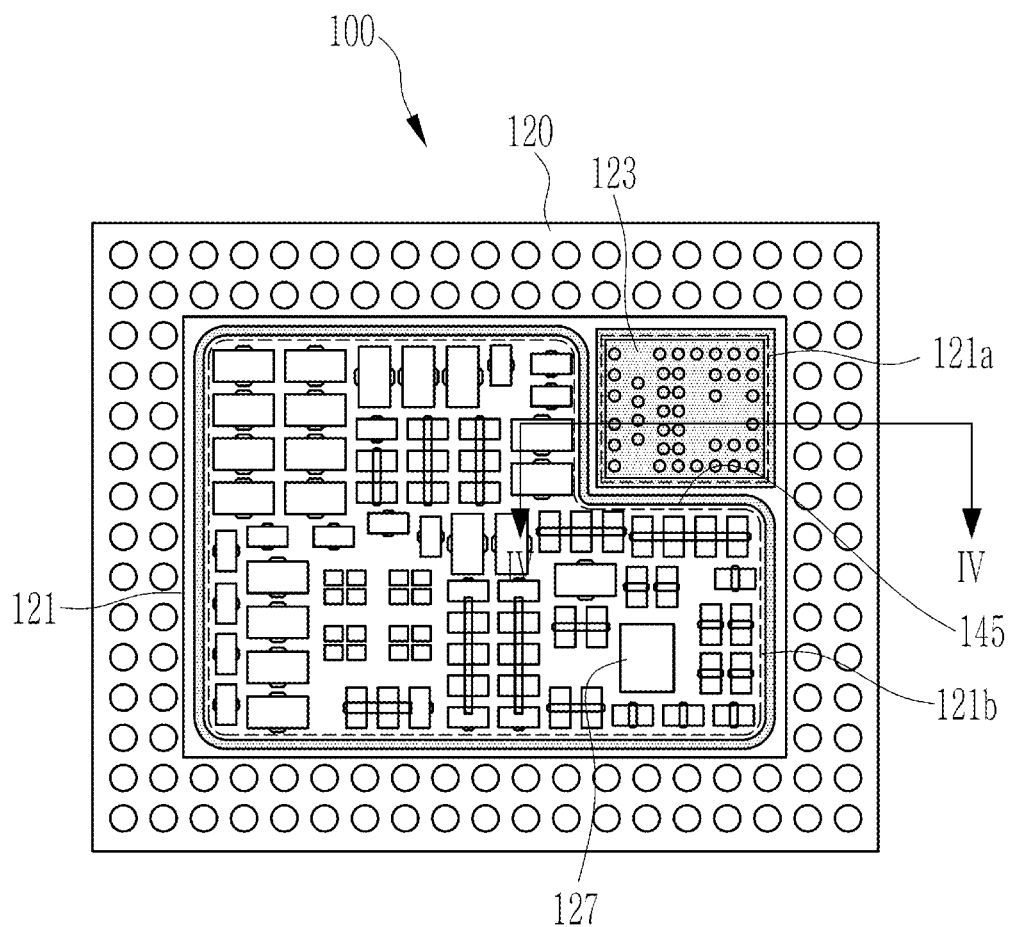
FIG. 3 shows a bottom view of the electronic device module shown in FIG. 1.
Figure 4:
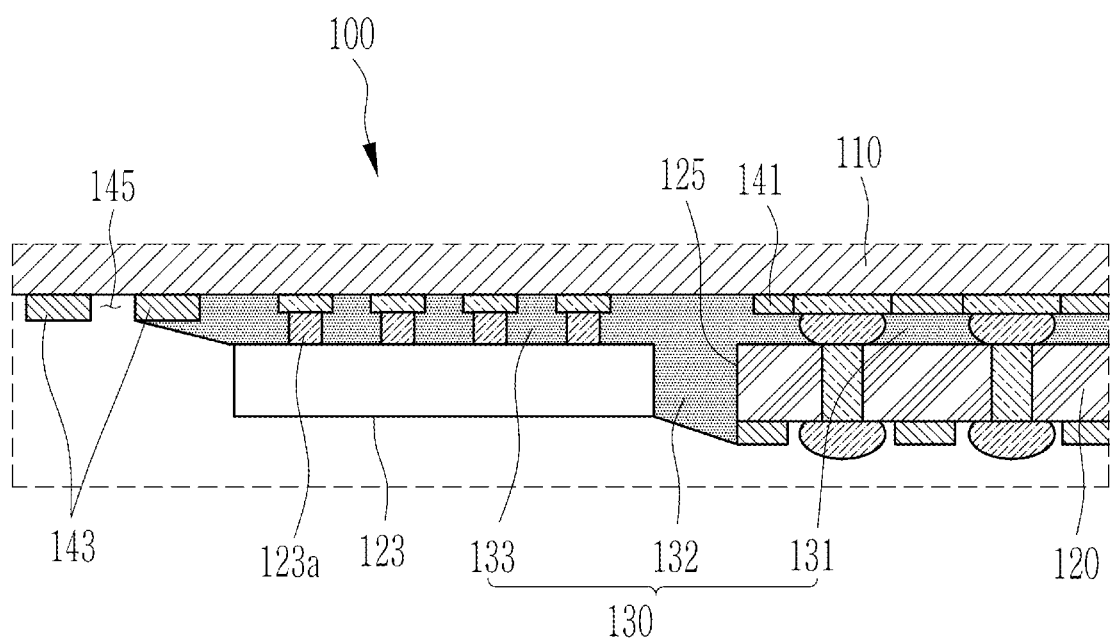
FIG. 4 shows a partial cross-sectional view taken along the line IV-IV' in FIG. 3.

FIG. 3 shows a bottom view of the electronic device module shown in FIG. 1, and FIG. 4 shows a partial cross-sectional view taken along the line IV-IV' in FIG. 3.

Referring to FIG. 3 and FIG. 4, the removed central portion of the second board 120 has a substantially rectangular shape in a plan view, and the second board 120 may have an internal edge side 125 having four sides along a circumference of the device accommodating portion 121 formed by removing the central portion. That is, the device accommodating portion 121 is formed by removing the central portion of the second board 120, so the internal edge side 125 of the second board 120 may define a boundary of the device accommodating portion 121.

A third electronic device 127 that may be any of various active elements or passive elements in addition to the second electronic device 123 may be mounted on the second side 110b of the first board 110 in the device accommodating portion 121 of the second board 120. However, the third electronic device 127 is separated from the second electronic device 123, and they are disposed in different regions of the device accommodating portion 121. That is, the second electronic device 123 may be disposed in a first region 121a of the device accommodating portion 121, and the third electronic device 127 may be disposed in a second region 121b of the device accommodating portion 121 that is different from the first region 121a.

In the device accommodating portion 121, the first region 121a may be separated from the second region 121b by a trench 145. That is, the trench 145 may extend along a boundary between the first region 121a and the second region 121b. Further, the trench 145 may extend to surround the second region 121b in the device accommodating portion 121. In a process for forming a bonding layer 130 between the first board 110 and the second board 120, the trench 145 may prevent a liquefied insulating material injected between the first board 110 and the second board 120 in the first region 121a of the device accommodating portion 121 from flowing into the second region 121b of the device accommodating portion 121.

The trench 145 may be formed by forming a recess in an insulating protection layer 143 disposed on the second side 110b of the first board 110. That is, the trench 145 may be formed by forming a recess in the insulating protection layer 143 disposed between the first region 121a and the second region 121b. For example, the insulating protection layer 143 may formed using a solder resist, and the trench 145 may be patterned when the solder resist of the second side 110b of the first board 110 is processed.

The second electronic device 123 may have a rectangular shape in a plan view. At least two lateral sides of the second electronic device 123 that are adjacent to each other may be disposed adjacent to the internal edge side 125 of the second board 120. The internal edge side 125 of the second board 120 may face an lateral side of the second electronic device 123. Therefore, when the liquefied underfill resin is injected, it may be injected from the internal edge sides 125 of at least two second boards 120 that are adjacent to each other and may flow to at least two lateral sides of the second electronic device 123 that are adjacent to the internal edge sides 125 of the at least two second boards 120 so that a processing speed may be increased.

An insulating protection layer 141 provided on the second side 110b of the first board 110 may be disposed in a gap between the first board 110 and the second board 120. The internal edge side 125 of the second board 120 may be disposed closer to the second electronic device 123 than the insulating protection layer 141 disposed in the gap between the first board 110 and the second board 120 in a direction that is perpendicular to the internal edge side 125 (i.e., in the y axis direction in the drawing). Accordingly, when the liquefied underfill resin is injected between the first board 110 and the second board 120, it naturally flows to the second electronic device 123 so the underfill 133 may be formed between the second electronic device 123 and the first board 110 by capillary action.

Therefore, the bonding layer 130 may include the underfill 131 filling the gap between the first board 110 and the second board 120, and the underfill 133 filling the gap between the second side 110b of the first board 110 and the second electronic device 123. Further, the bonding layer 130 may include the sidefill 132 filling a space between the internal edge side 125 of the second board 120 and a lateral side of the second electronic device 123 facing the internal edge side 125.

The bonding layer 130 may extend so that one end thereof may contact the trench 145. That is, the underfill 133 disposed between the second side 110b of the first board 110 and the second electronic device 123 may extend to the insulating protection layer 143 in which the trench 145 is formed, and may stop at the trench 145.

FIG. 5A to FIG. 5D are processing diagrams of a process for manufacturing the electronic device module shown in FIG. 1.

Figure 5A:
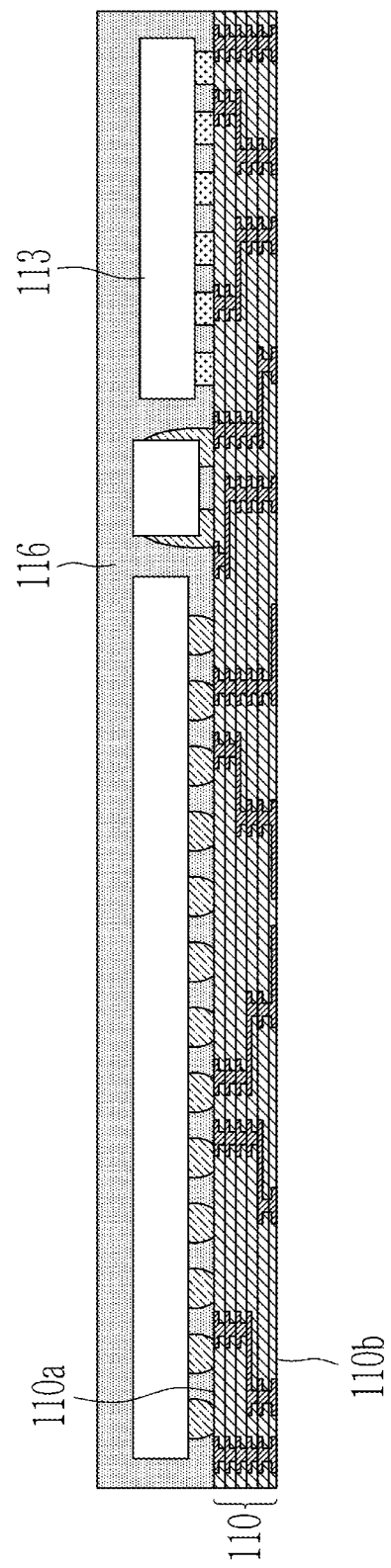
FIG. 5A to FIG. 5D are processing diagrams of a process for manufacturing an electronic device module shown in FIG. 1.

A first electronic device 113 is mounted on the first side 110a of the first board 110 including the first side 110a and the second side 110b facing in opposite directions (refer to FIG. 5A).

The first board 110 may be a multi-layered circuit board formed by interleaving a plurality of insulation layers and a plurality of wiring layers, and it may be configured as a double-sided circuit board in which wiring layers are disposed on opposite sides of one insulation layer.

The first electronic device 113 may be an active device such as an IC chip, or a passive device. That is, any type of device that may be mounted on the first board 110 or may be installed in the first board 110 is usable as the first electronic device 113. For example, the first electronic device 113 may be an RFIC chip, a WiFi IC chip, or an MLCC.

A molded portion 116 for covering and sealing the first electronic device 113 is disposed on the first side 110a of the first board 110 (refer to FIG. 5A).

The molded portion 116 covers and seals the first electronic device 113 on the first board 110, and the molded portion 116 extends to cover a side of the first electronic device 113 and thereby reach the first board 110. For example, the molded portion 116 may be made by using an epoxy mold compound (EMC) as a mold material.

Figure 5B:
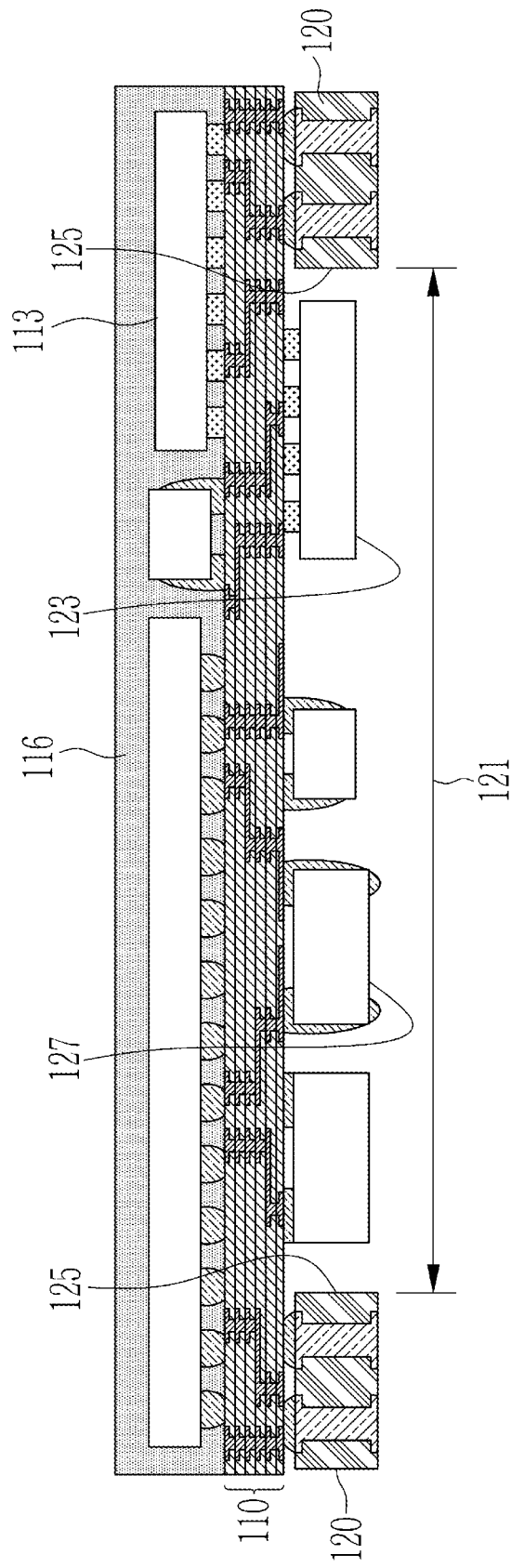

The second board 120 including the device accommodating portion 121 formed by removing the central portion of the second board 120 is attached to the first board 110 (refer to FIG. 5B).

The device accommodating portion 121 of the second board 120 may have a substantially rectangular shape in a plan view, and the second board 120 may have an internal edge side 125 along the circumference of the device accommodating portion 121. Therefore, when the second board 120 is attached to the first board 110, the device accommodating portion 121 forms a concave space exposing part of the second side 110b of the first board 110.

A second electronic device 123 is mounted on the second side 110b of the first board 110 by disposing the second electronic device 123 in the device accommodating portion 121 so that the second electronic device 123 is adjacent to the internal edge side 125 of the second board 120 defining the device accommodating portion 121 (refer to FIG. 5B).

The device accommodating portion 121 is formed by removing the central portion of the second board 120 so the internal edge side 125 of the second board 120 may define a boundary of the device accommodating portion 121. Further, the device accommodating portion 121 may have a substantially rectangular shape in a plan view, and the internal edge side 125 of the second board 120 may be configured to have four sides of which neighboring sides form substantially a right angle.

For example, the second electronic device 123 may have a rectangular shape in a plan view, and at least two lateral sides of the second electronic device 123 that are adjacent to each other may be disposed to be adjacent to the internal edge side 125 of the second board 120. The internal edge side 125 of the second board 120 may face the lateral sides of the second electronic device 123.

The second electronic device 123 may be an IC chip, and for example, it may be an RFIC chip. Also, the IC chip may be a chip-scale package (CSP).

Figure 5C:
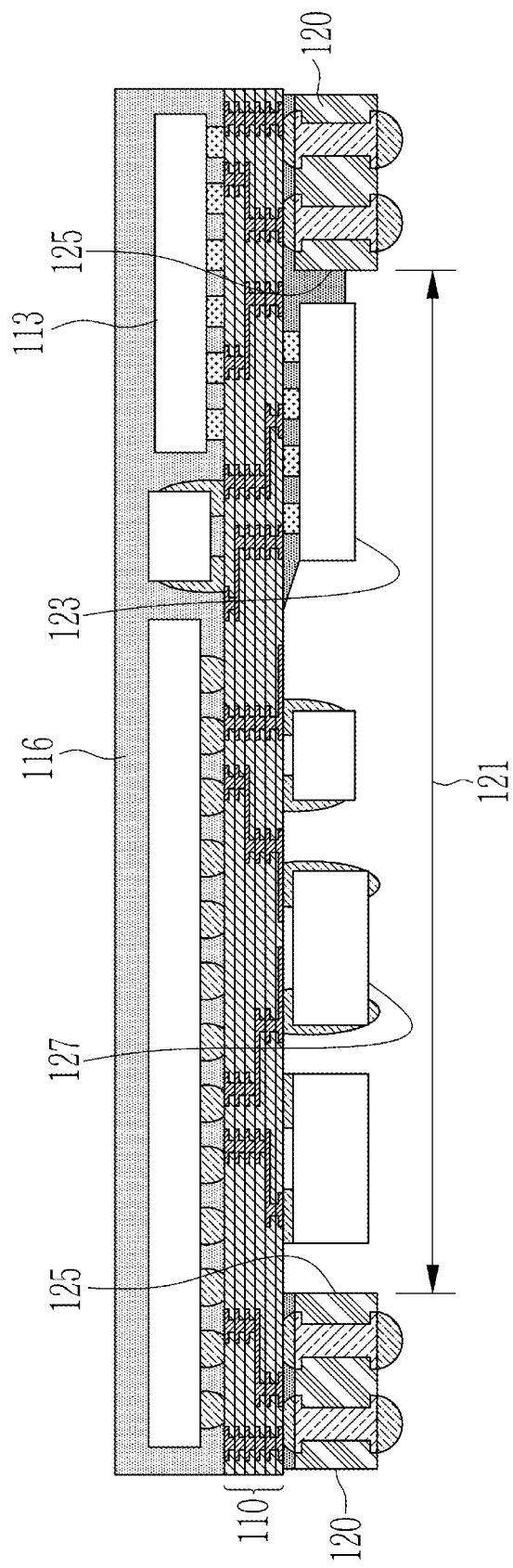

A liquefied insulating resin is injected into the gap between the first board 110 and the second board 120, and into the gap between the second side 110a of the first board 110 and the second electronic device 123, and is then cured (refer to FIG. 5C).

The liquefied insulating resin, for example, a liquefied underfill resin, may be injected so that it extends into the gap between the second side 110a of the first board 110 and the second electronic device 123 from the gap between the first board 110 and the second board 120. The liquefied underfill resin injected in this way may be cured to form a bonding layer 130.

Hence, when the liquefied underfill resin is injected between the first board 110 and the second board 120, it naturally flows into the gap between the second side 110b of the second electronic device 123, and an underfill may be formed between the second electronic device 123 and the first board 110 by capillary action.

Figure 5D:
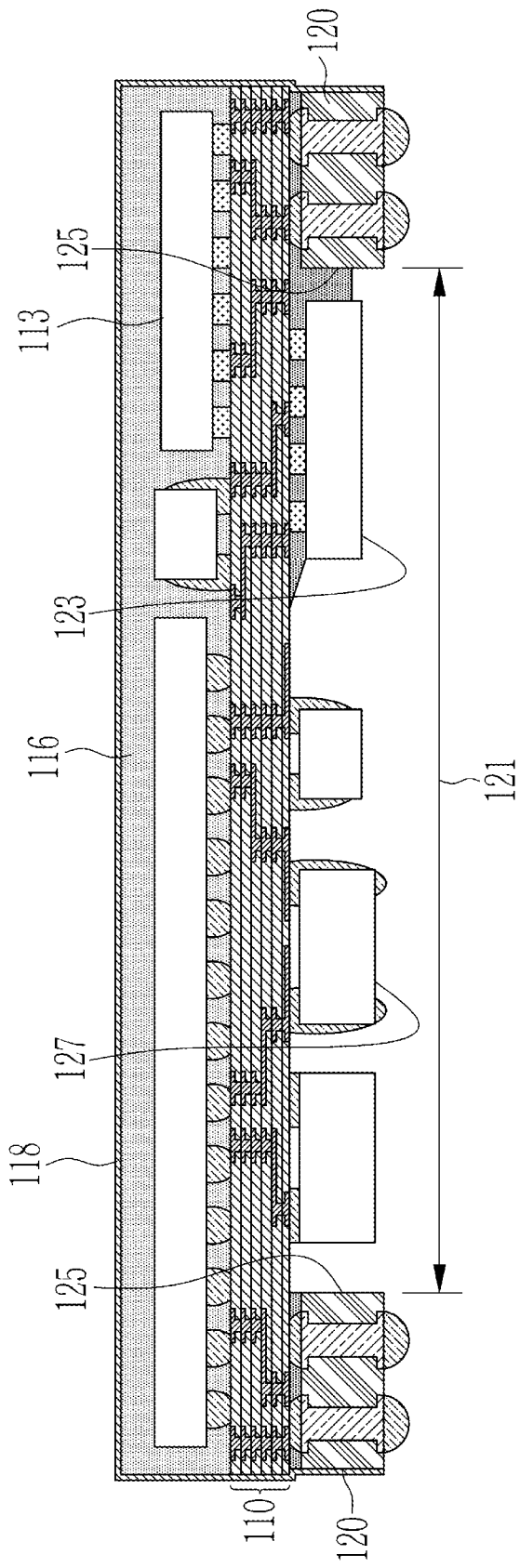

A conductive layer 118 covering an upper side and a lateral side of the molded portion 116 covering and sealing the first electronic device 113 on the first board 110, and extending to the lateral sides of the first board 110 and the second board 120, is formed (refer to FIG. 5D).

The conductive layer 118 may be formed by depositing a conductive material along a surface of the molded portion 116 and the lateral sides of the first board 110 and the second board 120 so that the conductive layer 118 functions as an electromagnetic interference (EMI) shielding film. For example, the conductive layer 118 may be deposited by a sputtering process.

Figure 6:
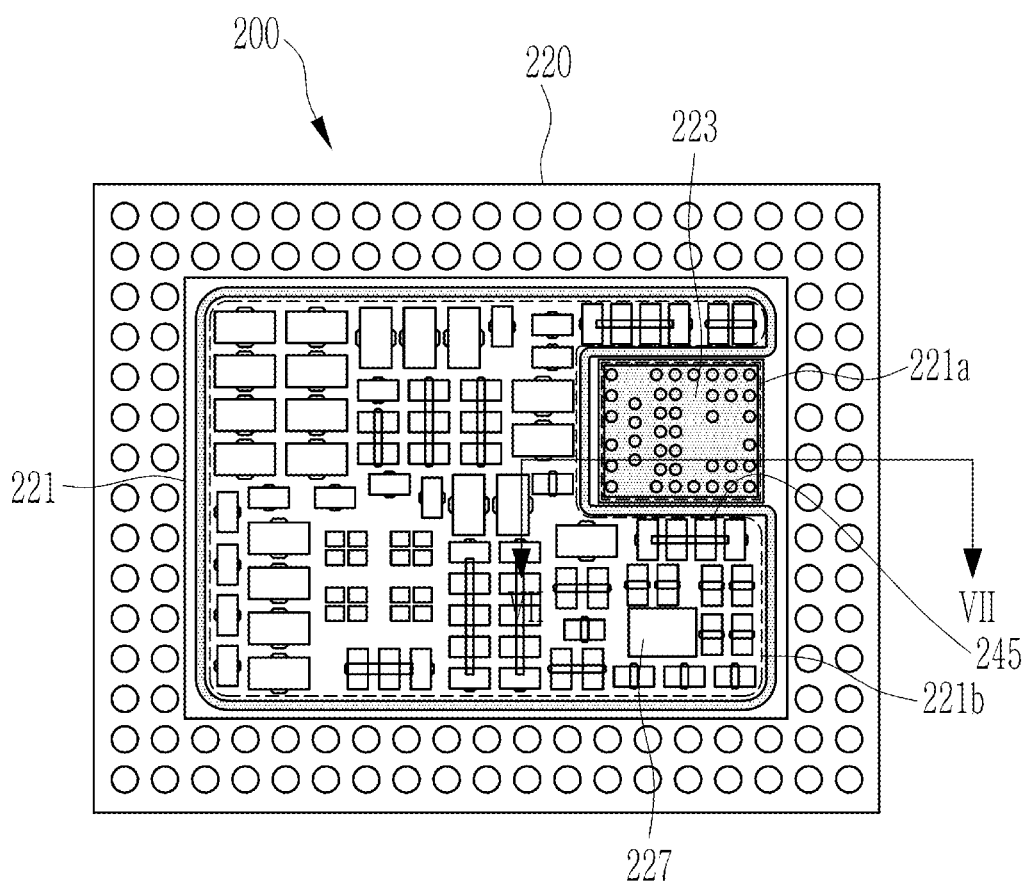
FIG. 6 shows a bottom view of another example of an electronic device module.
Figure 7:
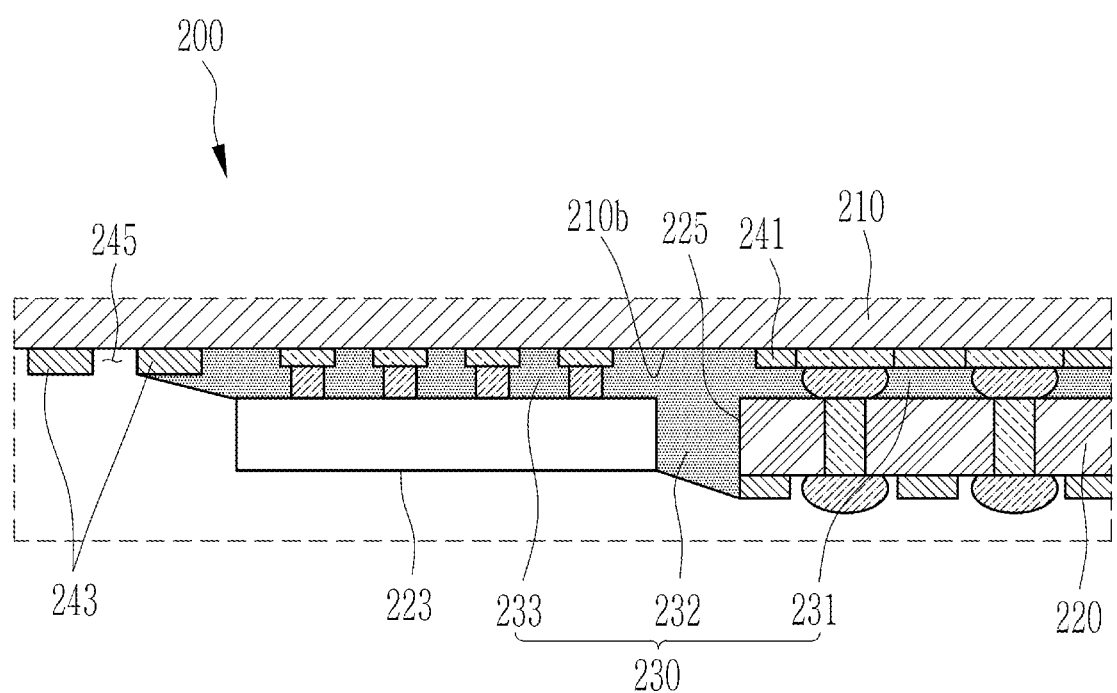
FIG. 7 shows a partial cross-sectional view taken along the line VII-VII' in FIG. 6.

FIG. 6 shows a bottom view of another example of an electronic device module, and FIG. 7 shows a partial cross-sectional view taken along the line VII-VII' in FIG. 6.

In an electronic device module 200, a third electronic device 227 that may be any of various active elements or passive elements other than a second electronic device 223 and the second electronic device 223 may be mounted on a second side 210b of a first board 210 in a device accommodating portion 221 of a second board 220. The third electronic device 227 is separated from the second electronic device 223. In particular, the second electronic device 223 may be disposed in a first region 221a of the device accommodating portion 221, and the third electronic device 227 may be disposed in a second region 221b of the device accommodating portion 221 that is different from the first region 221a.

For example, the second electronic device 223 may have a rectangular shape in a plan view, and one edge of the second electronic device 223 may be disposed near an internal edge side 225 of the second board 220. The internal edge side 225 of the second board 220 may face one edge side of the second electronic device 223.

The second electronic device 223 is an IC chip, and may be, for example, an RFIC chip. Further, the IC chip may be a chip-scale package (CSP).

In the device accommodating portion 221, the first region 221a and the second region 221b may be separated from each other by a trench 245. That is, the trench 245 may extend along the boundary between the first region 221a and the second region 221b. Further, the trench 245 may extend to surround the second region 221b in the device accommodating portion 221.

The trench 245 may be formed by forming a recess in an insulating protection layer 243 disposed on the second side 210b of the first board 210. That is, the trench 245 may be formed by forming a recess in the insulating protection layer 243 disposed between the first region 221a and the second region 221b.

An insulating protection layer 241 disposed on the second side 210b of the first board 210 may be disposed in the gap between the first board 210 and the second board 220. The internal edge side 225 of the second board 220 may be disposed closer to the second electronic device 223 than the insulating protection layer 241 disposed in the gap between the first board 210 and the second board 220 in a direction perpendicular to the internal edge side 225. Hence, when the liquefied underfill resin is injected between the first board 210 and the second board 220, it naturally flows to the second electronic device 223 to form an underfill between the second electronic device 223 and the first board 210 by capillary action.

Therefore, a bonding layer 230 includes an underfill 231 filling the gap between the first board 210 and the second board 223, and an underfill 233 filling a gap between the second side 210b of the first board 210 and the second electronic device 223. Further, the bonding layer 230 includes a sidefill 232 filling a space between the internal edge side 225 of the second board 220 and a lateral side of the second electronic device 223 facing the internal edge side 225.

The bonding layer 230 may extend so that one end thereof may contact the trench 245. That is, the underfill 233 disposed between the second side 210b of the first board 210 and the second electronic device 223 may extend to the insulating protection layer 243 in which the trench 245 is formed, and may stop at the trench 245.

According to the examples described above, a reliability against external physical impacts and temperature changes may be improved by increasing the bump solder adhesion of an electronic device in which the solder adhesive area is reduced because of a fine pitch and small bump structure mounted on a board of an electronic device module of a double-sided mounting type.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electronic device module comprising:
a first board comprising a first side and a second side facing in opposite directions, the first side of the first board being configured to have a first electronic device mounted thereon;
a second board adhered to the second side of the first board, and comprising a device accommodating portion that is a space formed by removing a central portion of the second board;
a second electronic device disposed in the device accommodating portion and mounted on the second side of the first board so that the second electronic device is adjacent to an internal edge side of the second board defining a boundary of the device accommodating portion; and
a bonding layer disposed in a gap between the first board and the second board and extending into a gap between the second side of the first board and the second electronic device, the bonding layer bonding the second board and the second electronic device to the first board,
wherein a lateral surface of the second electronic device adjacent to an internal edge side of the second board, is exposed to an outside.

2. The electronic device module of claim 1, further comprising an insulating protection layer disposed on the second side of the first board in the gap between the first board and the second board,
wherein the internal edge side of the second board is closer to a lateral side of the second electronic device is facing the internal edge side than to the insulating protection layer in a direction perpendicular to the internal edge side.

3. The electronic device module of claim 1, further comprising an insulating protection layer disposed on the second side of the first board and having a trench formed therein, the trench extending along a boundary between a first region of the device accommodating portion in which the second electronic device is mounted and a second region of the device accommodating portion different from the first region of the device accommodating portion.

4. The electronic device module of claim 3, wherein the trench extends to surround the second region in the device accommodating portion of the second board.

5. The electronic device module of claim 3, wherein the bonding layer extends so that one end of the bonding layer contacts the trench.

6. The electronic device module of claim 1, wherein the second electronic device has a rectangular shape when viewed in a direction perpendicular to the second side of the first board, and is disposed so that at least two lateral sides of the second electronic device that are adjacent to each other face the internal edge side of the second board and are adjacent to the internal edge side of the second board.

7. The electronic device module of claim 1, wherein the bonding layer comprises an underfill filling the gap between the second side of the first board and the second electronic device.

8. The electronic device module of claim 7, wherein the bonding layer further comprises a sidefill filling a space between the internal edge side of the second board and a lateral side of the second electronic device facing the internal edge side of the second board.

9. The electronic device module of claim 1, wherein the second electronic device is an integrated circuit (IC) chip.

10. The electronic device module of claim 9, wherein the IC chip is a radio-frequency integrated circuit (RFIC) chip.

11. The electronic device module of claim 9, wherein the IC chip is a chip-scale package (CSP).

12. The electronic device module of claim 1, wherein the bonding layer comprises an insulating resin.

13. An electronic device module comprising:
a first board comprising a first side and a second side facing in opposite directions, the first side of the first board being configured to have a first electronic device mounted thereon;
a second board adhered to the second side of the first board, and comprising a device accommodating portion that is a space formed by removing a central portion of the second board;
a second electronic device disposed in the device accommodating portion and mounted on the second side of the first board so that the second electronic device is spaced apart from an internal edge side of the second board defining a boundary of the device accommodating portion; and
a continuous bonding layer bonding the second board and the second electronic device to the first board, the continuous bonding layer filling a gap between the first board and the second board, extending across a space between the internal edge side of the second board and the electronic device, and filling a gap between the second side of the first board and the second electronic device,
wherein a lateral surface of the second electronic device adjacent to an internal edge side of the second board, is exposed to an outside.

14. The electronic device module of claim 13, further comprising an insulating protection layer disposed on the second side of the first board in the gap between the first board and the second board,
wherein the internal edge side of the second board is closer to a lateral side of the second electronic device facing the internal edge side than to the insulating protection layer in a direction perpendicular to the internal edge side.

15. The electronic device module of claim 13, further comprising an insulating protection layer disposed on the second side of the first board and having a trench formed therein, the trench dividing the device accommodating region into a first region in which the second electronic device is mounted and a second region,
wherein the insulating protection layer is spaced apart from the second electronic device, and
the continuous bonding layer extends from the gap between the second side of the first board and the second electronic device to the insulating protection layer across a space between the second electronic device and the insulating protection layer.

16. The electronic device module of claim 15, wherein the continuous bonding layer extends to contact the trench.

17. The electronic device module of claim 13, wherein the continuous bonding layer comprises:
- an underfill filling the gap between the first board and the second board,
- a sidefill filling the space between the internal edge side of the second board and the second electronic device, and
- an underfill filling the gap between the second side of the first board and the second electronic device.

18. The electronic device module of claim 17, further comprising external connection pads disposed on the second side of the first board within a mounting region of the second electronic device,
- wherein the second electronic device is a chip-scale package comprising copper pillar bumps soldered to the external connection pads, and
- the underfill filling the gap between the second side of the first board and the second electronic device surrounds the copper pillar bumps.

* * * * *